United States Patent

Wu et al.

[11] Patent Number: 5,633,520
[45] Date of Patent: May 27, 1997

[54] NEURON MOSFET WITH DIFFERENT INTERPOLYSILICON OXIDE

[75] Inventors: Chung-Cheng Wu, Toucheng; Ming-Tzong Yang, Hsin Chu, both of Taiwan

[73] Assignee: United Microelectronics Corporation, Hsin-Chu, Taiwan

[21] Appl. No.: 667,609

[22] Filed: Jun. 21, 1996

Related U.S. Application Data

[62] Division of Ser. No. 299,266, Sep. 1, 1994, Pat. No. 5,554,545.

[51] Int. Cl.$^6$ .................. H01L 27/108; H01L 29/76; H01L 29/788
[52] U.S. Cl. .................. 257/315; 257/300; 257/314; 257/316; 438/211; 438/981; 438/257
[58] Field of Search .................. 257/300, 314, 257/315, 316, 530; 437/43

[56] References Cited

U.S. PATENT DOCUMENTS

| | | | |
|---|---|---|---|
| 4,211,941 | 7/1980 | Schade, Jr. | 307/303 |
| 4,805,071 | 2/1989 | Hutter et al. | 361/313 |
| 4,841,352 | 6/1989 | Aso | 357/45 |
| 4,890,191 | 12/1989 | Rokos | 361/313 |
| 5,018,000 | 5/1991 | Yamada et al. | 357/51 |
| 5,038,184 | 8/1991 | Chiang et al. | 357/14 |
| 5,119,267 | 6/1992 | Sano et al. | 361/311 |
| 5,215,934 | 6/1993 | Tzeng | 437/43 |
| 5,291,439 | 3/1994 | Kauffmann et al. | 257/315 |
| 5,317,179 | 5/1994 | Chen et al. | 257/315 |

FOREIGN PATENT DOCUMENTS

| | | | |
|---|---|---|---|
| 56-60052 | 5/1981 | Japan | 257/315 |
| 2260219 | 4/1993 | United Kingdom | 257/530 |

OTHER PUBLICATIONS

Shibata et al., "Functional MOS Transistor Featuring Gate-Level Weighted Sum and Threshold Operations," IEEE Transactions on Electron Devices, vol. 39, No. 6, Jun. 1992, pp. 1444–1455.

*Primary Examiner*—Mahshid D. Saadat
*Assistant Examiner*—Valencia Martin Wallace
*Attorney, Agent, or Firm*—William H. Wright

[57] ABSTRACT

An MOSFET device is fabricated with a plurality of conductors capacitively coupled to a first electrode, forming a mask on the surface of the first electrode exposing a predetermined zone of the first electrode, doping the first electrode through the mask, removing the mask from the surface of the first electrode, oxidizing the first electrode to form a layer of oxide over the first electrode with a thicker layer of oxide over the predetermined zone and a thinner layer of oxide elsewhere, forming at least one electrode over the first electrode on the thinner layer of oxide outside of the zone and forming at least one other electrode over the first electrode on the thicker layer of oxide inside the zone, whereby the one electrode and the other electrode have substantially different capacitive coupling to the electrode.

7 Claims, 6 Drawing Sheets

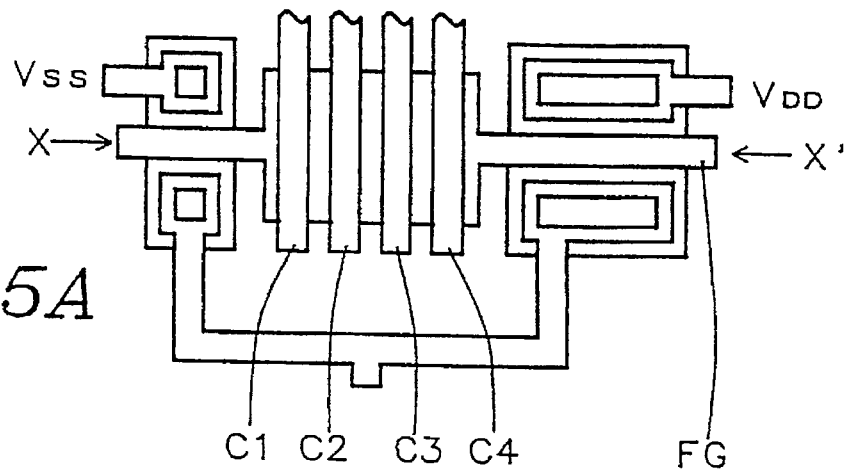
FIG. 5A Prior Art
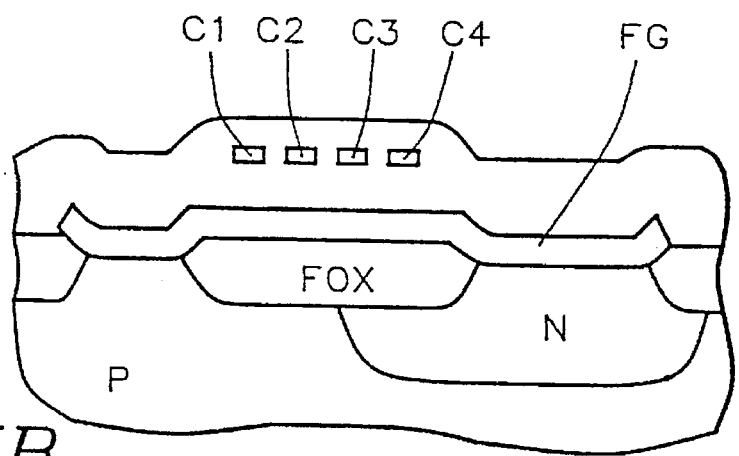
FIG. 5B Prior Art
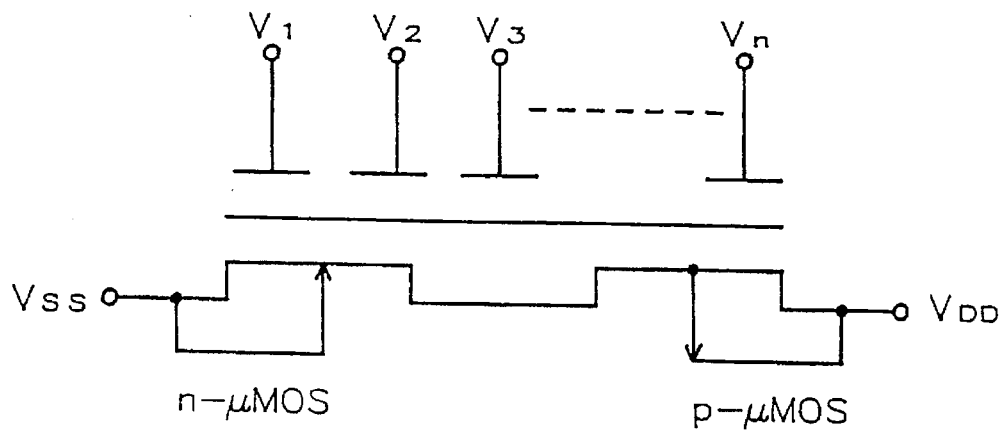
FIG. 5C – Prior Art

NEURON MOSFET WITH DIFFERENT INTERPOLYSILICON OXIDE This is a division of application Ser. No. 08/299,266 filed on Sep. 1, 1994, U.S. Pat. No. 5,554,545.

BACKGROUND OF THE INVENTION

1. Field of the Invention

This invention relates to semiconductor devices and more particularly to neuron MOSFET devices.

2. Description of Related Art

Heretofore, in semiconductor devices with plural input circuits, a weighted sum of input signals has been achieved by employing capacitors with different capacitor areas with the same interpolysilicon oxide thickness which may require large capacitor area to obtain different weighting factors.

The neuron MOSFET (neuMOS) is so named because it is considered to be analogous in function to a biological neuron. The neuMOS includes double polysilicon structures utilized as coupling capacitor. See Shibata et al "Functional MOS Transistor Featuring Gate-Level Weighted Sum and Threshold Operations", IEEE Transactions on Electron Devices, Vol. 39, No. 6, p 1444–1455 (June, 1992)

U.S. Pat. No. 5,215,934 of Tzeng shows a different thickness depending upon where the ion implantation is present or is absent from the silicon surface with argon, boron, antimony, arsenic, or any group III or IV dopant applied for enhancing the rate of oxidation in silicon which has been damaged by the process of implantation of such dopants. The variable thickness is employed for providing a two tiered tunnel oxide upon which a floating gate and control gate are formed across the two tiers for the purpose of as stated at Col. 7, lines 11–12 "reducing drain disturbance in EEPROM arrays . . ." It also states at Col. 2, lines 52–54 "it is also desired to thicken the gate oxide near the drain region to reduce drain disturbance phenomena . . ."

U.S. Pat. No. 5,038,184 of Chiang et al shows a thin film varactor structure.

U.S. Pat. No. 5,119,267 of Sano et al, U.S. Pat. No. 5,018,000 of Yamada et al, U.S. Pat. No. 4,890,191 of Rokos; U.S. Pat. No. 4,841,320 of Aso; U.S. Pat. No. 4,805,071 of Hutter et al; and U.S. Pat. No. 4,211,941 of Schade show processes for making capacitors. However, these processes fail to increase capacitance without increasing the area required.

In prior technology:

$$\phi_F = \frac{\sum_{i=0}^{i=n} C_i V_i}{C_{TOT}} \qquad C_i \doteq E_{ox} \frac{A_i}{T_{ox}}$$

where $\phi_F$ = floating gate potential
$A_i$ = area of the $i$th capacitor
$E_{ox}$ = dielectric constant of oxide
$T_{ox}$ = oxide thickness $$C_{TOT} = C_o + \sum_{i=1}^{n} C_i$$

$$\phi_F = \frac{1}{C_{TOT}} \sum_{i=1}^{i=n} E_{ox} \left( \frac{A_i}{T_{ox}} V_i \right)$$

-continued $$\phi_F = \frac{1}{C_{TOT}} \sum_{i=1}^{i=n} A_i V_i$$

SUMMARY OF THE INVENTION

In accordance with this invention a device is provided and a process for fabricating an MOSFET device in a predetermined zone with a plurality of conductors capacitively coupled to a first electrode is provided. The process comprises, forming a mask on the surface of the first electrode exposing a predetermined zone of the first electrode, doping the first electrode through the mask, removing the mask from the surface of the first electrode, oxidizing the first electrode to form a layer of oxide over the first electrode with a thicker layer of oxide over the predetermined zone and a thinner layer of oxide elsewhere, forming at least one electrode over the first electrode on the thinner layer of oxide outside of the zone and forming at least one other electrode over the first electrode on the thicker layer of oxide inside the zone, whereby the one electrode and the other electrode have substantially different capacitive coupling to the electrode.

Preferably, the first electrode comprises polysilicon doped by a blanket ion implantation with dopants, the implantation being performed at an energy within a range of energies from about 10 keV to about 200 keV, and a range of doses from about from about 1E15 cm$^{-2}$ to about 5E16 cm$^{-2}$; the first electrodes is subjected to another ion implantation through a mask into a predetermined zone with dopant ions implanted through an opening applied with an energy within a range of energies from about 10 keV to about 200 keV, with a dose within a range of doses from about 1E15 cm$^{-2}$ to about 5E16 cm$^{-2}$; after the first electrode is subjected to ion implantation, the entire device Is subjected to thermal oxidation in a furnace in an atmosphere of oxygen gas alone or in combination with hydrogen gas at a temperature within a range from about 750° C. to about 1000° C. to form over the polysilicon, a thinner silicon oxide layer having a thickness $T_{ox2}$ from 100 Å to substantially less than 1,000 Å and over a predetermined zone where the polysilicon layer was more heavily doped a thicker silicon oxide layer having a thickness $T_{ox1}$ from substantially greater than 100 Å to 1,000 Å; after the thermal oxidation, deposition of a second polysilicon laser follows, patterned by formation of patterned photoresist mask employed for etching through the mask to remove unwanted portions of the second polysilicon layer to form the conductors C1, C2, Cn-1 and Cn (where n is a positive integer;) the second polysilicon layer is doped with dopants implanted with an energy within a range of energies from about 10 keV to about 200 keV with a range of doses from about from about 1E15 cm$^{-2}$ to about 5E16 cm$^{-2}$; the product of the preceding steps has formed thereon a blanket of silicon dioxide layer, the silicon dioxide layer being formed in a furnace by a CVD process in an atmosphere of oxygen or oxygen with hydrogen gas at a temperature within a range from about 700° C. to about 1,000° C.; the silicon dioxide layer has a thickness from about 1000 Å to about 8,000 Å; the device includes NMOS and PMOS devices formed adjacent to the predetermined zone; and the device includes NMOS and PMOS devices formed adjacent to the predetermined zone.

BRIEF DESCRIPTION OF THE DRAWINGS

The foregoing and other aspects and advantages of this invention are explained and described below with reference to the accompanying drawings, in which:

FIGS. 5A–5C show a prior art complementary neuMOS inverter circuit.

DESCRIPTION OF THE PREFERRED EMBODIMENT

This invention provides means for achieving a weighted sum of input signals by using different interpolysilicon oxide thickness, which can reduce the capacitor area. Different capacitors can be produced by varying the thickness of the interpolysilicon oxide which is controlled by the dosage of the polysilicon 1 layer.

FIGS. 1A–1E show a process flow for manufacture of a device in accordance with this invention.

Figure 1A:
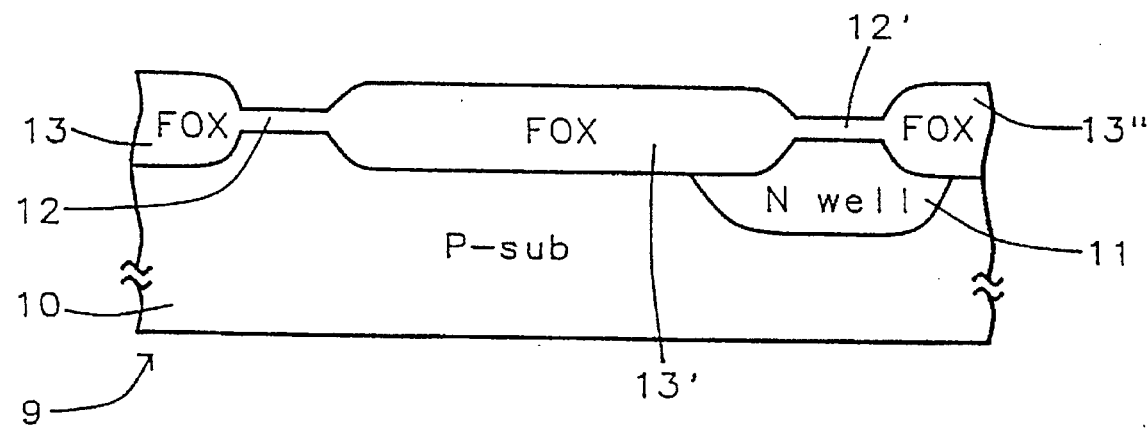
FIGS. 1A–1G show a process flow for manufacture of a device in accordance with this invention.

In FIG. 1A, device 9 comprises silicon which has been doped to form a P-substrate 10. On the surface of substrate 10 are formed by thick field oxide (FOX) regions 13, 13' and 13" separated by thin gate oxide layer 12 on the left and thin gate oxide layer 12' on the right. Beneath gate oxide layer 12' is an N well 11 formed beneath gate oxide layer 12'.

Formation of Common (Polysilicon 1) Electrode Layer

Figure 1B:
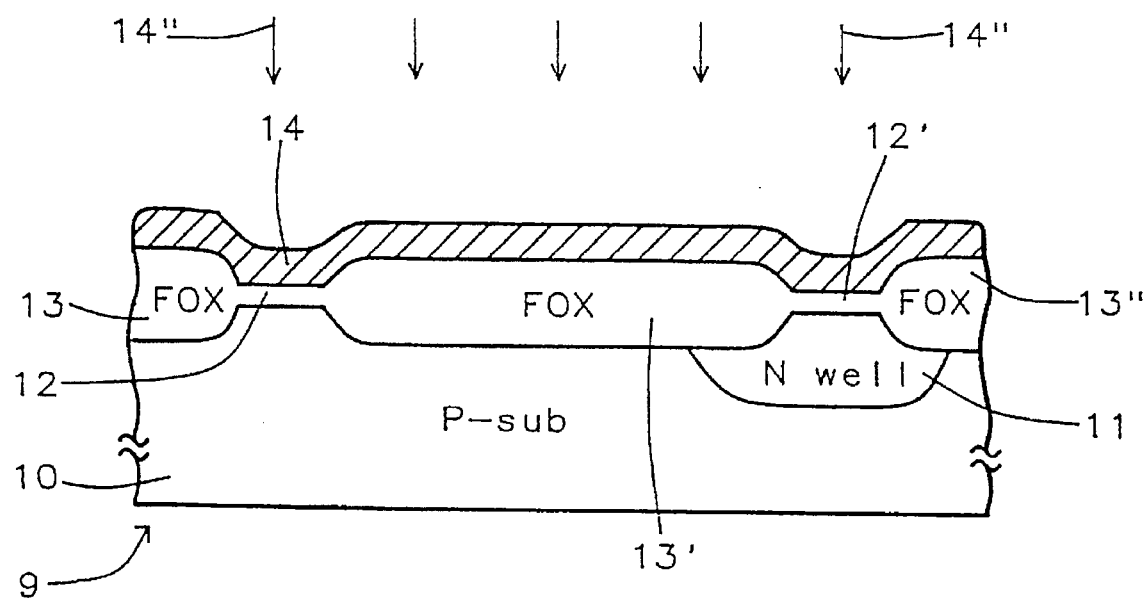

Referring to FIG. 1B, the device of FIG. 1A is shown with a blanket polysilicon 1 layer 14 formed on the surface of device 9 including the FOX regions 13, 13' and 13", gate oxide layer 12, and gate oxide layer 12' by means of a conventional process, well known to those skilled in the art. For example, one well known process involves pyrolyzing silane between 575° C. and 650° C. in a low pressure reactor. Then in the first case of low pressure formation of polysilicon, 100% silane is used at a pressure of 0.2Torr to 1.0Torr. In the second case of low pressure formation of polysilicon, the process uses the same pressure range, but uses 20% to 30% silane diluted in nitrogen gas.

First Doping of Polysilicon 1 (Blanket Implantation)

A blanket implantation of polysilicon 1 layer 14 with phosphorous (P31) dopant is performed, preferably with an energy of about 50 keV. A range of energies from about 20 keV to about 100 keV is possible. The dose is preferably 1E16 cm$^{-2}$ of P31 dopant. A range of doses from about 1E15 cm$^{-2}$ to about 5E16 cm$^{-2}$ is possible.

Patterning of Common (Polysilicon 1) Electrode Layer

Figure 1C:
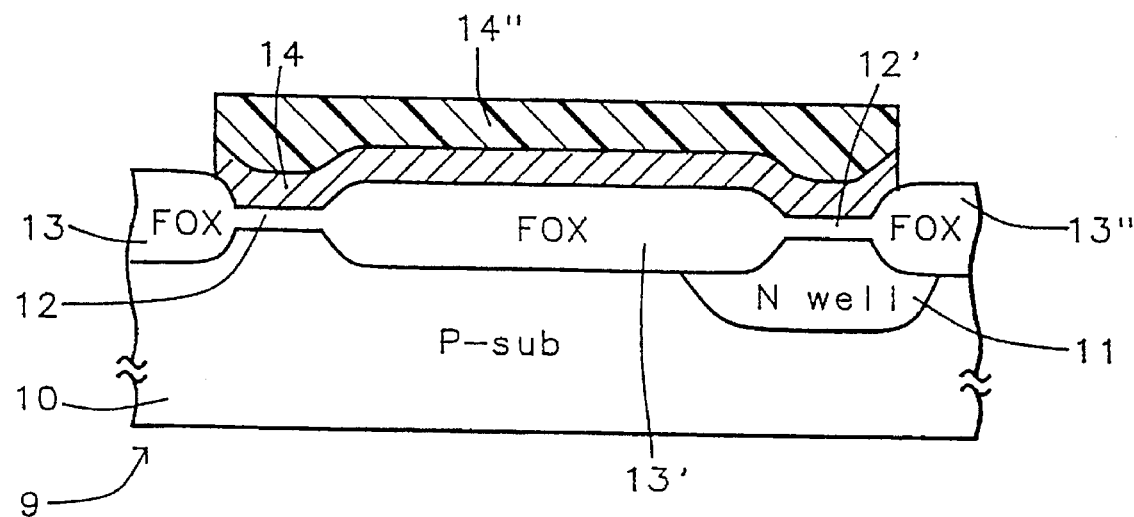

Then a photoresist mask 14" is formed on the surface of the polysilicon 1 layer 14 to form the electrode 14 as shown in FIG. 1C stretching across the from the end of FOX region 13 across gate oxide 12, FOX region 13', gate oxide 12' and to the near end of FOX region 13".

Next photoresist mask 14" is stripped from device 9.

Mask for Thick Dielectric Region

Figure 1D:
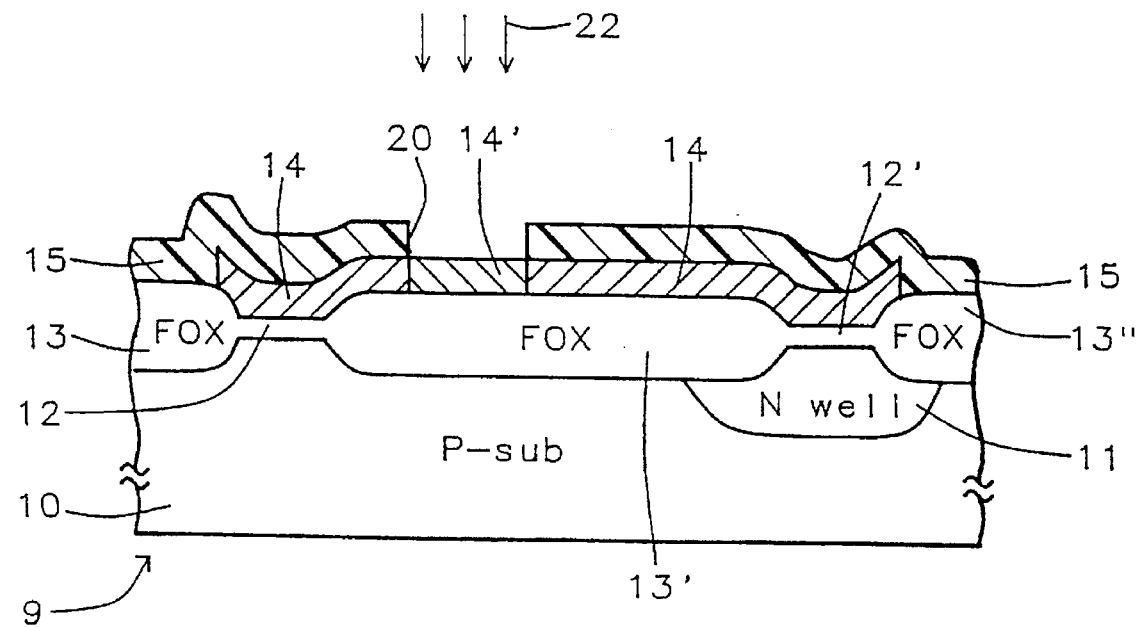

Next, referring to FIG. 1D, the device of FIG. 1C is shown with a photoresist mask 15 formed on the surface of the polysilicon 1 common electrode layer 14 and exposed portions of FOX regions 13, and 13" with an opening 20 in mask 15 over FOX 13' near the end thereof nearest to gate oxide layer 12.

Implantation of Thick Polysilicon 1 Region

Next, as shown in FIG. 1D, dopant ions 22 are implanted through opening 20 into polysilicon 1. The dopant ions 22 of phosphorous (P31) are implanted through the opening 20 into zone 14' of polysilicon 1 layer 14 to increase the dopant level of region 14' far above that of regions 14. The dopant is applied at a preferred dose of 5E15 cm$^{-2}$ of P31 at a preferred energy of 50 keV to provide a far higher level of doping in region 14' than in the remainder of polysilicon 1 layer 14. A range of energies from about 20 keV to about 100 keV is possible. A range of doses from about 1E15 cm$^{-2}$ to about 5E16 cm$^{-2}$ is possible.

Remove Mask

The photoresist layer 15 is then removed.

Thermal oxidation of Polysilicon 1

Figure 1E:
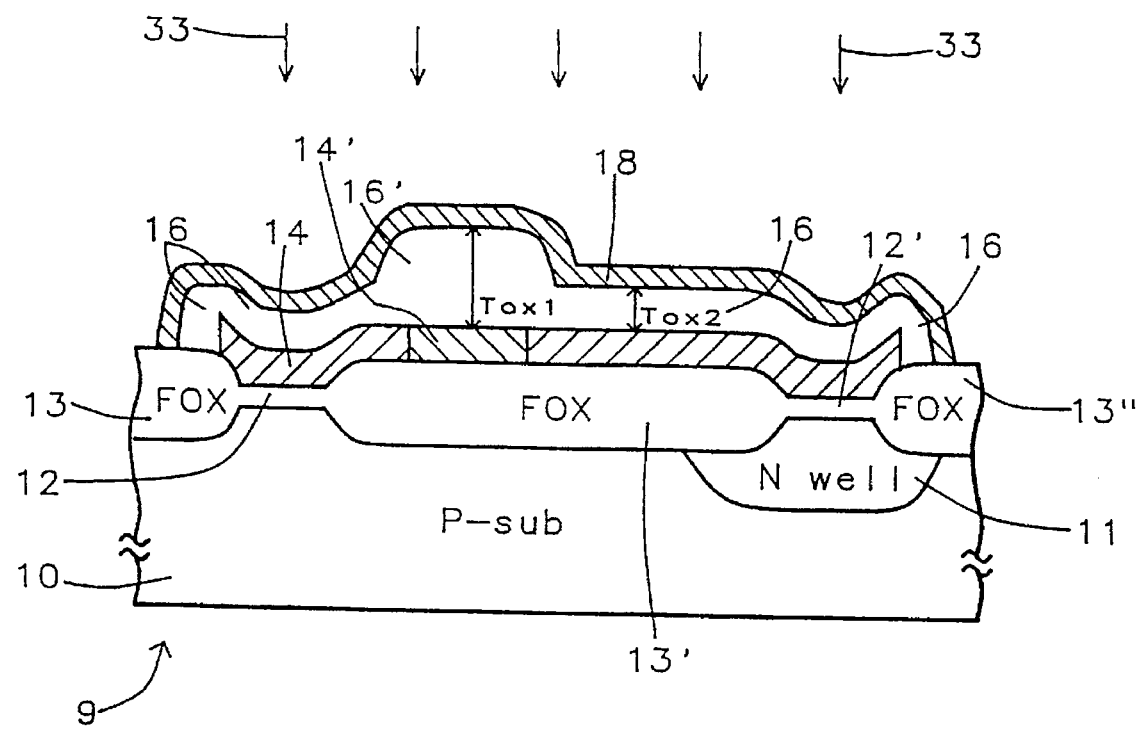

Next, referring to FIG. 1E, the device of FIG. 1D, (after implantation of the zone of 14' in polysilicon 1 conductor 14 and removal of the mask 15), the entire device 9 is subjected to thermal oxidation in a furnace chamber in an atmosphere of oxygen $O_2$ gas at a temperature within a range from about 750° C. to about 1,000° C. forming over polysilicon layer 14 a thinner silicon oxide layer 16 having a thickness $T_{ox2}$ from 100 Å to substantially less than 1,000 Å, and over polysilicon 1 zone 14' a thicker silicon oxide layer 16' having a greater thickness $T_{ox1}$ from substantially greater than 100 Å to 1,000 Å. Note the thicker $SiO_2$ in region 16' above the zone 14' where polysilicon 1 layer 14 was more heavily doped.

Formation of Other (Polysilicon 2) Electrode Layer

Referring again to FIG. 1E, deposition of a blanket polysllicon 2 layer 18 follows. The layer 18 is formed by a similar process to layer 14, as described above.

Next, the polysilicon 2 layer 18 is doped with phosphorus (P31) by ion implantation of ions 33. The implantation of ions 33 in layer 18 is performed preferably with an energy of about 60 keV. A range of energies from about 20 keV to about 100 keV is possible. The dose is preferably of P31 dopant. A range of doses from about 1E15 cm$^{-2}$ to about 5E16 cm$^{-2}$ is possible.

Masking and Etching to Form Capacitor Plates

Figure 1F:
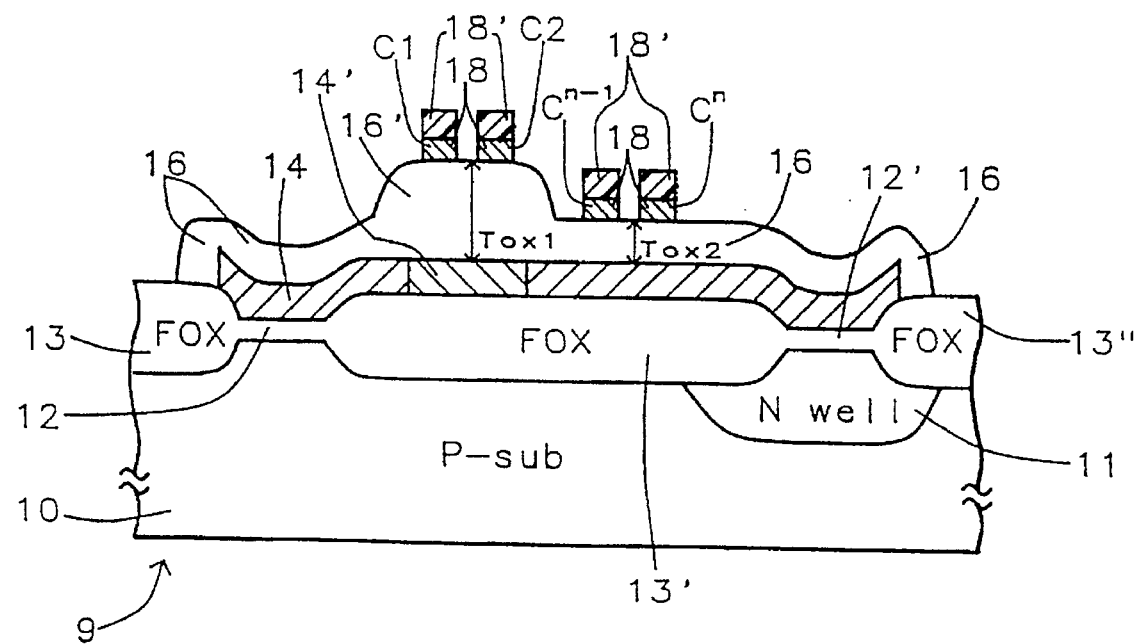

Next, referring to FIG. 1F, the device of FIG. 1E shows the polysilicon 2 layer 18 covered with a photoresist mask 18' which was patterned photolithographically. That mask 18' is employed for etching through the mask to remove unwanted portions of layer 18 to form the conductors C1, C2, Cn-1 and Cn (where n is a positive integer.)

Formation of Additional Dielectric Layer

Figure 1G:
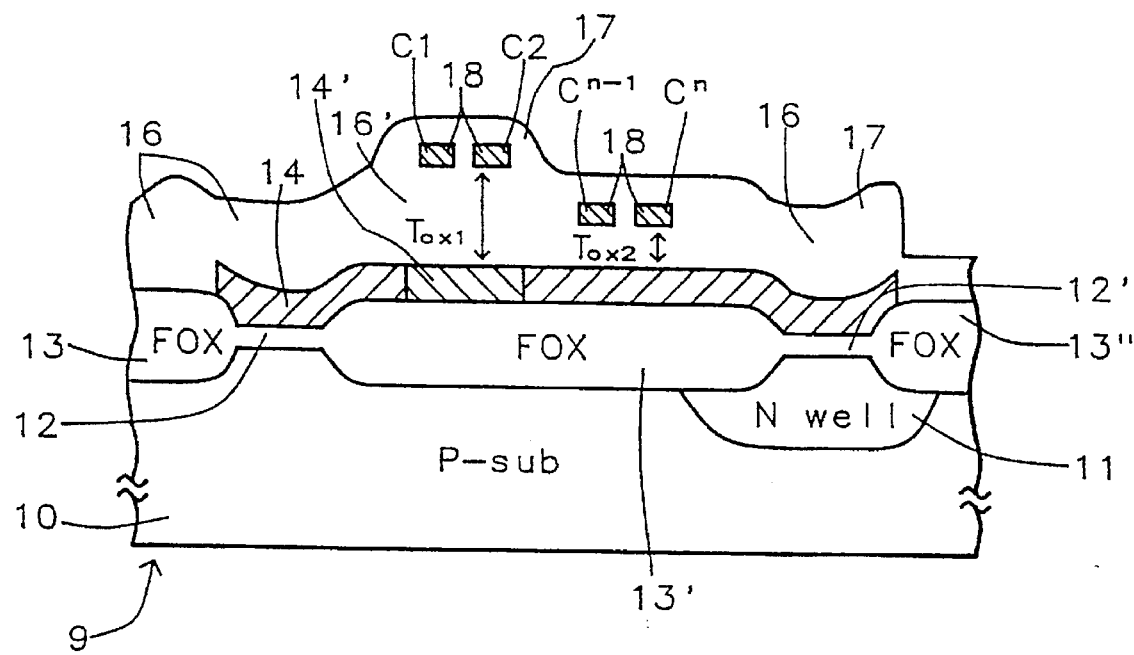

Next the device 9 of FIG. 1F is shown in FIG. 1G after deposition of a blanket layer 17 of additional silicon dioxide formed by the process of chemical vapor deposition CVD in an atmosphere of $SiH_4+N_2O$ gas at a temperature within a range from about 300° C. to about 500° C. The silicon dioxide layer 17 has a thickness from about 1,000 Å to about 8,000 Å over the entire surface of the device.

Figure 2:
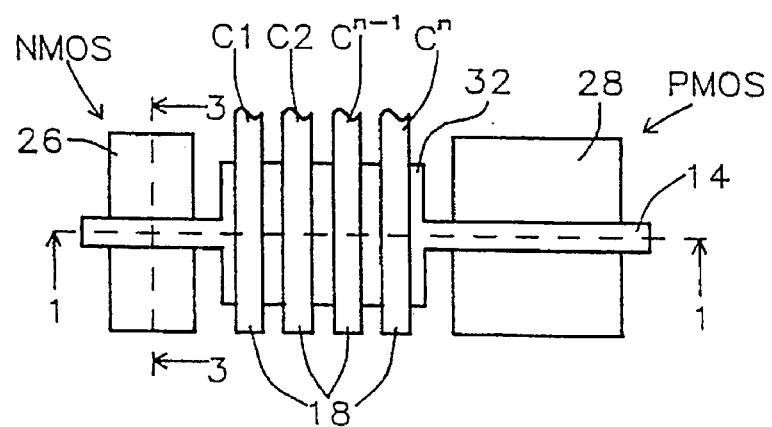
FIG. 2 shows a reduced scale plan view of a larger portion of the device of FIGS. 1A–1G and FIG. 3.

FIG. 2 shows a reduced scale plan view of a larger portion of the device 9 of FIGS. 1A–1G and FIG. 3 in accordance with this invention with a PMOS region 26, an NMOS region 28, floating gate electrode 30 composed of polysilicon 1, a plate 32 composed of polysilicon 1, a plurality of polysilicon 2 conductors C1, C2, Cn and Cn-1 (where n is an integer.) A section line 1—1 indicates a section seen in FIG. 1G, and a section line 3—3 indicates a section seen in FIG. 3.

Figure 3:
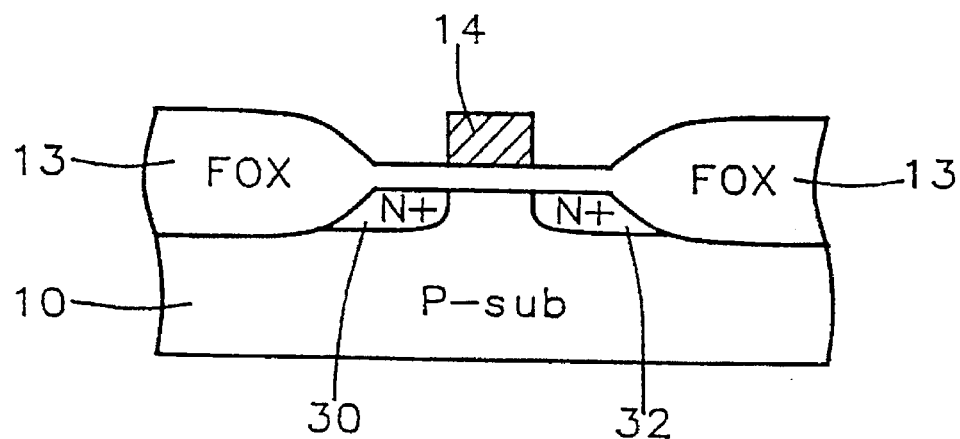
FIG. 3 shows a section of FIG. 2 along line 3—3.

FIG. 3 shows the section of device 9 taken along line 3—3 in FIG. 2 with substrate 10, FOX regions 13, polysilicon element 14, N+doped regions 30 and 32.

Figure 4:
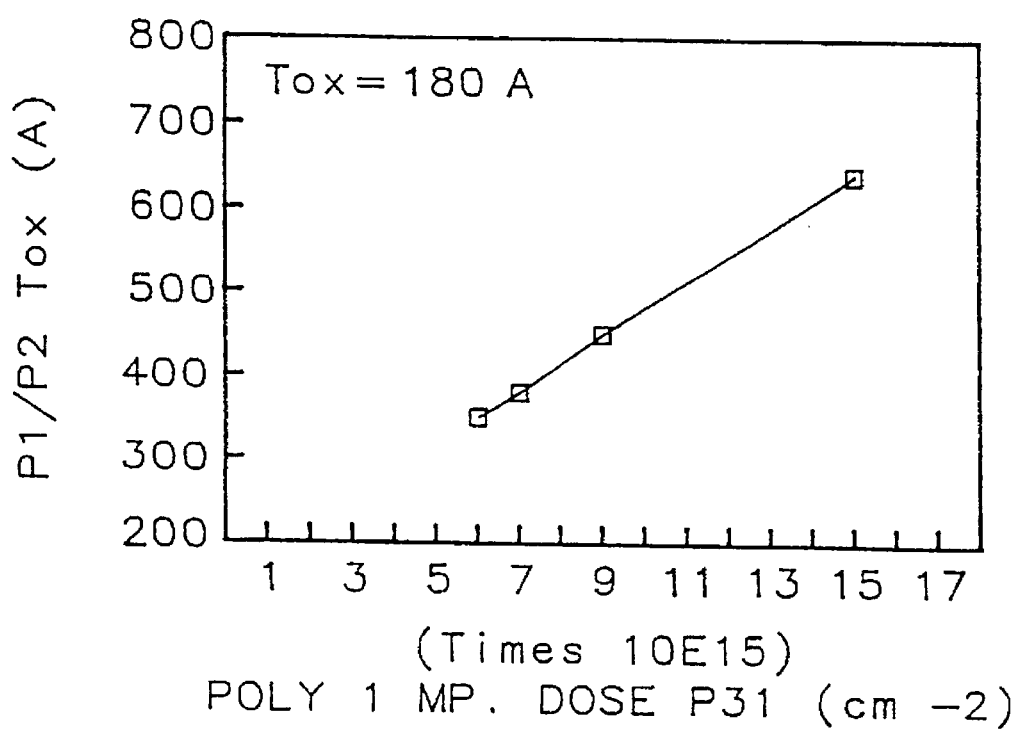
FIG. 4 shows a plot of the thickness $T_{ox}$ of the oxide vs the dose in a polysilicon 1 layer.

Referring to FIG. 4 which is a plot of the thickness $T_{ox}$ of the oxide in Angstroms vs the dose in a polysilicon 1 layer, the thickness of interpolysilicon oxide formed from a constant growth time (e.g. layers 16 and 16', versus polysilicon 1 implantation dosage (P) is shown in FIG. 1E. The dopant applied comprises phosphorus P31. The values of the graph are from 360 Å to about 620 Å for corresponding dosages ranging from 6E15 cm$^{-2}$ to 1.5E16 cm$^{-2}$. The values obtained are linear therefore, the thickness of the interpolysilicon oxide can be controlled by the implanted dose of polysilicon 1 layer 14 in both region 14 and region 14'.

FIGS. 5A–5C show a prior art complementary neuMOS inverter circuit from Shibata et al, above, page 1448, where it is stated that "A possible layout and the cross section of a complementary neuMOS inverter are depicted . . . , along with its symbol representation. The n- and p-channel devices are called n-channel neuMOS and p-channel neuMOS, respectively, and the n-neuMOS and p-neuMOS both share the same floating gate in the C-neuMOS inverter. FIG. 5A is a pattern layout with conductor C1 and floating gate FG. FIG. 5B is a cross section taken at line X—X' with conductor C1, C2, C3, C4 and floating gate FG plus the N well in the P-sub. FIG. 5C is a symbol representation. It can be seen in FIG. 5B that the conductors are spaced a uniform distance from the floating gate FG.

$$C_i = E_{ox} \frac{A_i}{T_{oxi}}$$

$$\phi_F = \frac{1}{C_{TOT}} E_{ox} \left( \sum_{i=0}^{i=n} \frac{A_{i1}}{T_{ox1}} V_{i1} + \sum_{j=0}^{j=n} \frac{A_{j2}}{T_{ox2}} V_{j2} + \sum_{k=0}^{k=n} \frac{A_{k3}}{T_{ox3}} V_{k3} + \ldots \right)$$

While this invention has been described in terms of the above specific embodiment(s), those skilled in the art will recognize that the invention can he practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A MOSFET device with a plurality of conductors capacitively coupled to a first polysilicon electrode, the device comprising:

a first electrode including a highly doped zone:

a thinner layer of silicon oxide over said first electrode and a thicker layer of silicon oxide over said highly doped zone of said first electrode;

at least one first upper electrode over said first electrode on said thinner layer of silicon oxide; and at least one second upper electrode over said first electrode on said thicker layer of silicon oxide.

2. A device in accordance with claim 1 wherein said first electrode comprises polysilicon doped by a blanket ion implantation with dopants, said implantation having been performed at an energy within a range of energies from about 10 keV to about 200 keV, and a range of doses from about from about 1E15 cm$^{-2}$ to about 5E16 cm$^{-2}$.

3. A device in accordance with claim 2 wherein said first electrode is subjected to another ion implantation through a mask into said zone with dopant ions implanted through an opening applied with an energy within a range of energies from about 10 keV to about 200 keV, with a dose within a range of from about 1E15 cm$^{-2}$ to about 5E16 cm$^{-2}$.

4. A device in accordance with claim 3 wherein said thinner silicon oxide layer has a thickness $T_{ox2}$ from 100 Å to less than 1,000 Å, and over said zone where said first electrode was more heavily doped said thicker silicon oxide layer having a thickness $T_{ox1}$ from greater than 100 Å to less than 1,000 Å.

5. A device in accordance with claim 4 wherein a blanket silicon dioxide layer is formed over said first upper electrode and said second upper electrode having a thickness from about 1,000 Å to about 8,000 Å.

6. A MOSFET device with a plurality of conductors capacitively coupled to a first polysilicon electrode, the device comprising:

a first electrode;

a thinner layer of silicon oxide and a thicker layer of silicon oxide over said first electrode;

at least one first upper electrode over said first electrode on said thinner layer of silicon oxide; and at least one second upper electrode over said first electrode on said thicker layer of silicon oxide.

7. The device of claim 6, wherein there are at least two first upper electrodes on said thinner layer of silicon oxide and at least two second upper electrodes on said thicker layer of silicon oxide.

\* \* \* \* \*